(12) United States Patent
Okada et al.

(10) Patent No.: US 7,691,445 B2
(45) Date of Patent: Apr. 6, 2010

(54) FILM FORMATION APPARATUS AND METHOD OF USING THE SAME

(75) Inventors: Mitsuhiro Okada, Kai (JP); Toshiharu Nishimura, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 302 days.

(21) Appl. No.: 11/562,198

(22) Filed: Nov. 21, 2006

(65) Prior Publication Data
US 2007/0117398 A1    May 24, 2007

(30) Foreign Application Priority Data

Nov. 24, 2005   (JP) ............... 2005-338438
Oct. 13, 2006   (JP) ............... 2006-279768

(51) Int. Cl.
*B05D 3/04*   (2006.01)

(52) U.S. Cl. ............... 427/348; 427/349; 427/350; 156/345; 134/3; 134/33

(58) Field of Classification Search ........... 427/348; 156/345; 134/3
See application file for complete search history.

(56) References Cited

U.S. PATENT DOCUMENTS 6,065,481 A * 5/2000 Fayfield et al. ............. 134/1.3
6,955,177 B1 * 10/2005 Chiu et al. ................. 134/1.2
2005/0066993 A1 * 3/2005 Hasebe et al. ............. 134/1

FOREIGN PATENT DOCUMENTS

| CN | 1539159 A | 10/2004 |
|---|---|---|
| JP | 3-293726 | 12/1991 |

* cited by examiner

*Primary Examiner*—Shamim Ahmed
*Assistant Examiner*—Maki Angadi
(74) *Attorney, Agent, or Firm*—Oblon, Spivak, McClelland, Maier & Neustadt, L.L.P.

(57) ABSTRACT

A method of using a film formation apparatus for a semiconductor process includes removing by a cleaning gas a by-product film deposited on an inner surface of a reaction chamber of the film formation apparatus, and then chemically planarizing the inner surface of the reaction chamber by a planarizing gas. The inner surface contains as a main component quartz or silicon carbide. The removing is performed while supplying the cleaning gas into the reaction chamber, and setting the reaction chamber at a first temperature and first pressure to activate the cleaning gas. The planarizing is performed while supplying the planarizing gas into the reaction chamber, and setting the reaction chamber at a second temperature and second pressure to activate the planarizing gas. The planarizing gas contains fluorine gas and hydrogen gas.

17 Claims, 6 Drawing Sheets

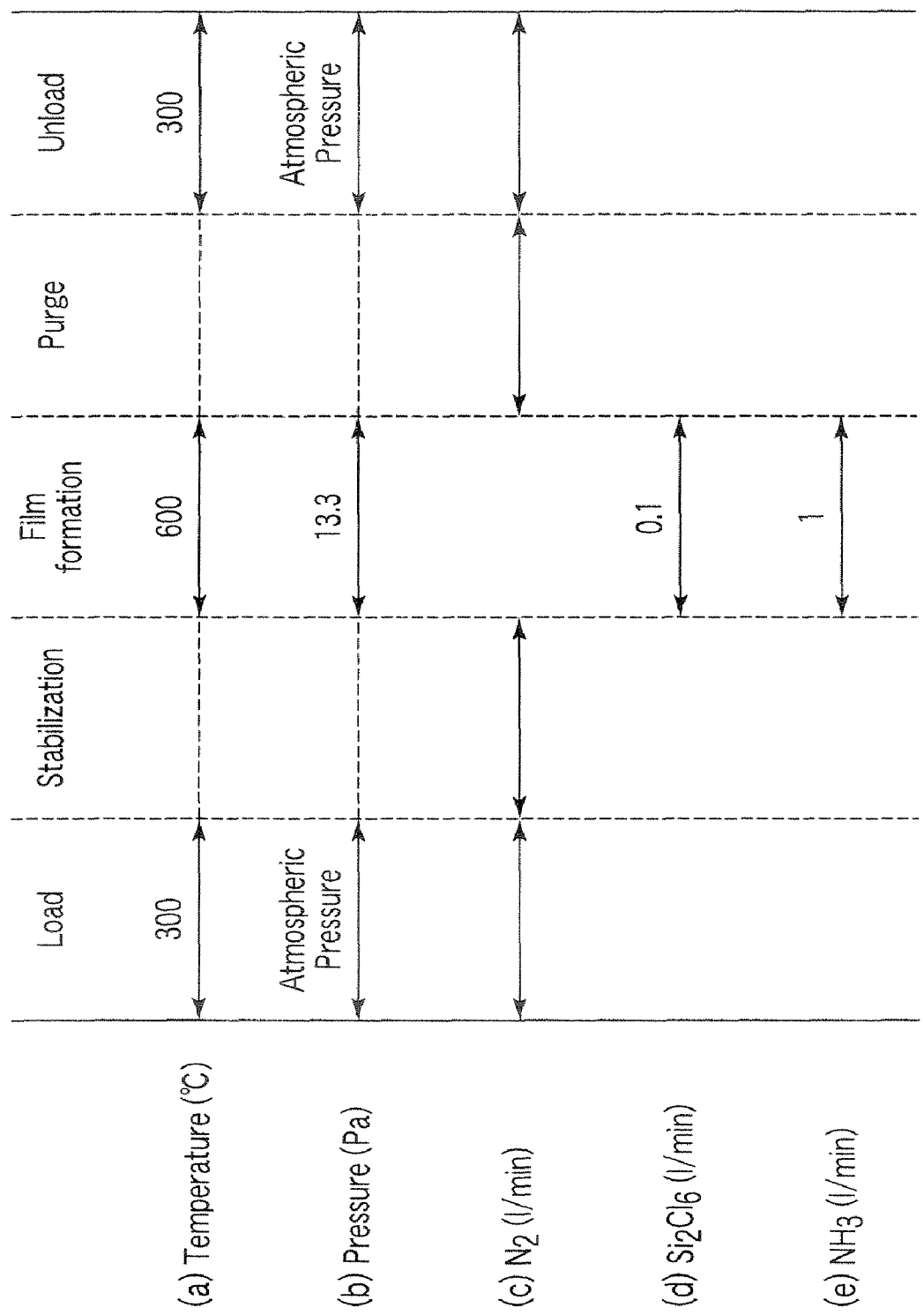
F I G. 3

| Composition | H₂ | N₂ | F₂ |
|---|---|---|---|
| CP1 | 0 | 8 | 2 |
| CP2 | 0.25 | 8 | 1.75 |
| CP3 | 0.5 | 8 | 1.5 |
| CP4 | 0.75 | 8 | 1.25 |

(l/min)

| Compositon | H₂ | N₂ | F₂ |
|---|---|---|---|
| CP5 | 0.25 | 8 | 2 |
| CP6 | 0.5 | 8 | 2 |
| CP7 | 0.75 | 8 | 2 |
| CP8 | 1 | 8 | 2 |

(l/min)

FILM FORMATION APPARATUS AND METHOD OF USING THE SAME

CROSS-REFERENCE TO RELATED APPLICATIONS

This application is based upon and claims the benefit of priority from prior Japanese Patent Applications No. 2005-338438, filed Nov. 24, 2005; and No. 2006-279768, filed Oct. 13, 2006, the entire contents of both of which are incorporated herein by reference.

BACKGROUND OF THE INVENTION

1. Field of the Invention

The present invention relates to a film formation apparatus for a semiconductor process for forming a film on a target substrate, such as a semiconductor wafer, and also to a method of using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film or silicon dioxide film, on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is reduced to a predetermined pressure.

Then, while the interior of the reaction tube is kept at the predetermined temperature and pressure (kept exhausted), a film formation gas is supplied through a process gas feed line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the interior of the reaction tube, some of the by-product films separate therefrom and generate particles. The particles may drop on the semiconductor wafer, and reduce the yield of semiconductor devices to be fabricated.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube are dry-etched and removed by the cleaning gas. Jpn. Pat. Appln. KOKAI Publication No. 3-293726 discloses a cleaning method of this kind. However, as described later, the present inventors have found that, when a film formation process is performed after the interior of a reaction tube is subjected to cleaning, a problem may arise in that the film formation rate (deposition rate) is lowered, or a product film suffers particle contamination.

BRIEF SUMMARY OF THE INVENTION

An object of the present invention is to provide a film formation apparatus for a semiconductor process and a method of using the same, which can prevent a decrease in deposition rate and particle contamination after cleaning.

According to a first aspect of the present invention, there is provided a method of using a film formation apparatus for a semiconductor process, the method comprising:

removing by a cleaning gas a by-product film deposited on an inner surface of a reaction chamber of the film formation apparatus, while supplying the cleaning gas into the reaction chamber, and setting an interior of the reaction chamber at a first temperature and a first pressure to activate the cleaning gas, wherein the inner surface of the reaction chamber contains as a main component a material selected from the group consisting of quartz and silicon carbide; and then, chemically planarizing the inner surface of the reaction chamber by a planarizing gas, while supplying the planarizing gas into the reaction chamber, and setting the interior of the reaction chamber at a second temperature and a second pressure to activate the planarizing gas, wherein the planarizing gas contains fluorine gas and hydrogen gas.

According to a second aspect of the present invention, there is provided a film formation apparatus for a semiconductor process, comprising:

a reaction chamber configured to accommodate a target substrate, wherein an inner surface of the reaction chamber contains as a main component a material selected from the group consisting of quartz and silicon carbide;

a heater configured to heat an interior of the reaction chamber;

an exhaust system configured to exhaust the interior of the reaction chamber;

a film formation gas supply circuit configured to supply a film formation gas, for forming a film on the target substrate, into the reaction chamber;

a cleaning gas supply circuit configured to supply a cleaning gas, for removing from the inner surface a by-product film derived from the film formation gas, into the reaction chamber;

a planarizing gas supply circuit configured to supply a planarizing gas, for chemically planarizing the inner surface, into the reaction chamber, the planarizing gas containing fluorine gas and hydrogen gas; and a control section configured to control an operation of the apparatus, wherein the control section executes removing by the cleaning gas a by-product film deposited on the inner surface of the reaction chamber, while supplying the cleaning gas into the reaction chamber, and setting the interior of the reaction chamber at a first temperature and a first pressure to activate the cleaning gas; and then, chemically planarizing the inner surface of the reaction chamber by the planarizing gas, while supplying the planarizing gas into the reaction chamber, and setting the interior of the reaction chamber at a second temperature and a second pressure to activate the planarizing gas.

According to a third aspect of the present invention, there is provided a computer readable medium containing program instructions for execution on a processor, which, when executed by the processor, cause a film formation apparatus for a semiconductor process to execute removing by a cleaning gas a by-product film deposited on an inner surface of a reaction chamber of the film formation apparatus, while supplying the cleaning gas into the reaction chamber, and setting an interior of the reaction chamber at a first temperature and a first pressure to activate the cleaning gas, wherein the inner surface of the reaction chamber contains as a main component a material selected from the group consisting of quartz and silicon carbide; and then, chemically planarizing the inner surface of the reaction chamber by a planarizing gas, while supplying the planarizing gas into the reaction chamber, and setting the interior of the reaction chamber at a second temperature and a second pressure to activate the planarizing gas, wherein the planarizing gas contains fluorine gas and hydrogen gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a view showing the recipe of a film formation process according to an embodiment of the present invention;

DETAILED DESCRIPTION OF THE INVENTION

Figure 1:
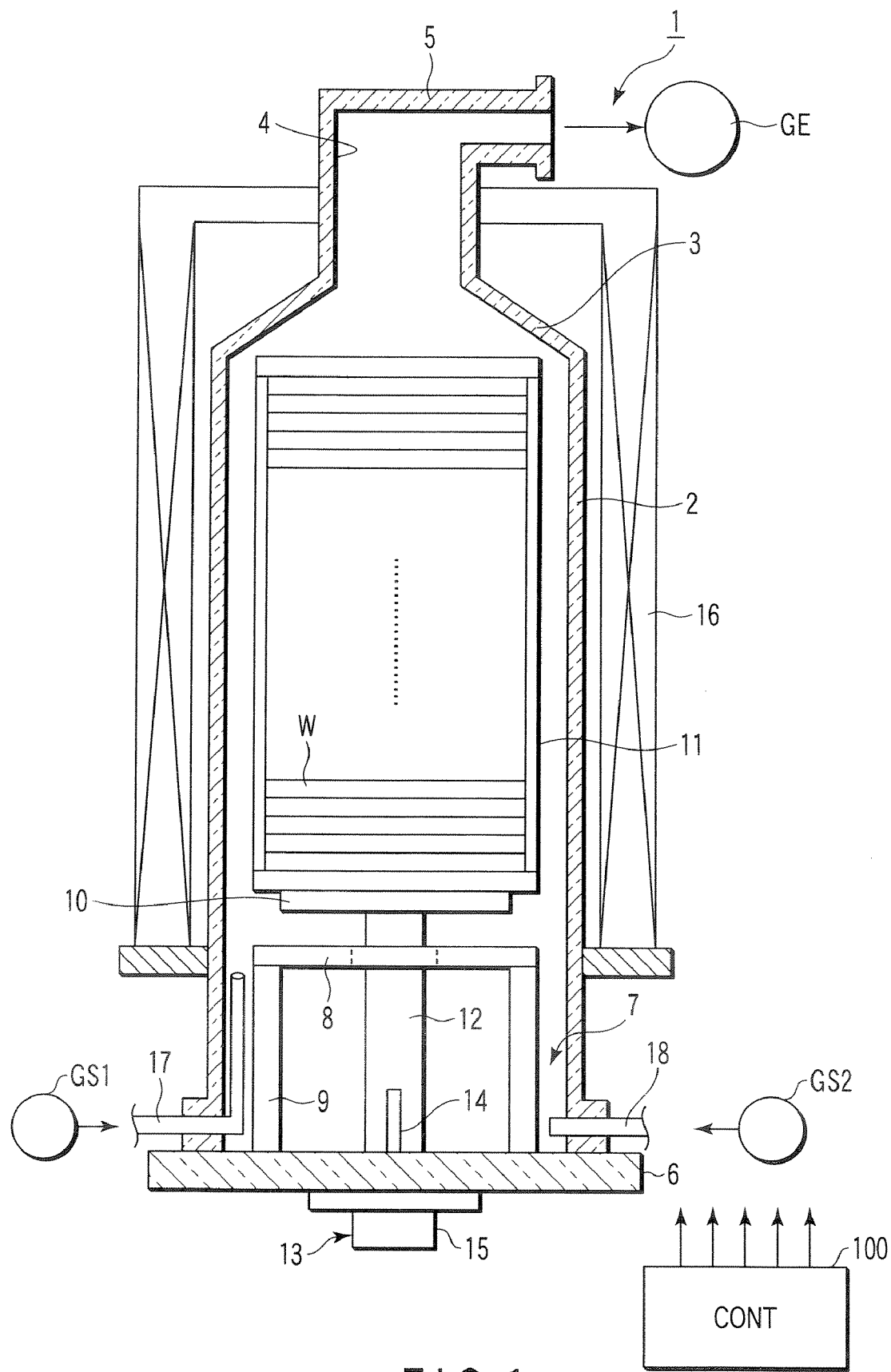
FIG. 1 is a view showing a vertical heat-processing apparatus according to an embodiment of the present invention.

In the process of developing the present invention, the inventors studied a decrease in deposition rate and particle contamination after cleaning with regard to conventional methods for cleaning the interior of a reaction tube used in a film formation apparatus for a semiconductor process. As a result, the inventors have arrived at the findings given below.

Specifically, after a film formation process is repeated a plurality of times, the inner surface of a reaction tube may be damaged and suffer cracks formed thereon by a stress given by by-product films. Particularly, where a film formation process of a silicon nitride film is performed in a quartz reaction tube, by-product films formed by this process apply a relatively large stress to the reaction tube. Consequently, large cracks tend to be easily formed on the inner surface of the reaction tube.

The cracks are exposed on the inner surface of the reaction tube when the by-product films are removed therefrom by cleaning. The cracks on the inner surface of the reaction tube increase the surface area, and may thereby cause the deposition rate to decrease. Further, quartz powder can easily separate and drop from the cracks of the reaction tube and generate particles.

In order to solve this problem, a hydrogen fluoride (HF) solution, for example, may be used to clean the reaction tube. In this case, by-product films and cracks can be removed together by wet etching. However, this wet etching requires work operations for detaching the reaction tube, manually cleaning the tube, and then reattaching and adjusting the tube. Further, the heat-processing apparatus needs to be shut down for a long time, thereby increasing the downtime of the apparatus and lowering the operating rate thereof.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat-processing apparatus according to an embodiment of the present invention. As shown in FIG. 1, the heat-processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz.

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g., a valve and a vacuum exhaust pump. The exhaust section GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz. The lid 6 is moved up and down by a boat elevator described later (not shown in FIG. 1, but shown in FIG. 2 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, e.g., 100, semiconductor wafers W at predetermined intervals in the vertical direction. The wafer boat 11 is made of a heat-resistant and corrosion-resistant material, such as quartz. Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as a film formation gas, a cleaning gas, and a planarizing gas) into the reaction tube 2. Each process gas feed line 17 is connected to a process gas supply source GS1 through a mass-flow controller (MFC) described later (not shown in FIG. 1, but shown in FIG. 2 with a reference symbol 125).

A mixture gas of hexachlorodisilane ($Si_2Cl_6$) and ammonia ($NH_3$), for example, is used as a film formation gas to form a silicon nitride film on the semiconductor wafers W. A mixture gas of fluorine ($F_2$), hydrogen ($H_2$), and nitrogen ($N_2$), for example, is used as a cleaning gas to remove by-product films deposited inside the reaction tube 2. A gas containing fluorine ($F_2$) and hydrogen ($H_2$), such as a mixture gas of fluorine ($F_2$), hydrogen ($H_2$), and nitrogen ($N_2$), is used as a planarizing gas.

Although FIG. 1 shows only one process gas feed line 17, a plurality of process gas feed lines 17 are disposed in accordance with gases to be supplied into the reaction tube 2 in the respective process steps, in this embodiment. Specifically, a film formation gas feed line for supplying the film formation gas into the reaction tube 2, a cleaning gas feed line for supplying the cleaning gas into the reaction tube 2, and a planarizing gas feed line for supplying the planarizing gas into the reaction tube 2 penetrate the sidewall of the reaction tube 2 near the bottom.

A purge gas feed line 18 also penetrates the sidewall of the reaction tube 2 near the bottom. The purge gas feed line 18 is connected to a purge gas supply source GS2 through an MFC described later (not shown in FIG. 1, but shown in FIG. 2 with a reference symbol 125).

Figure 2:
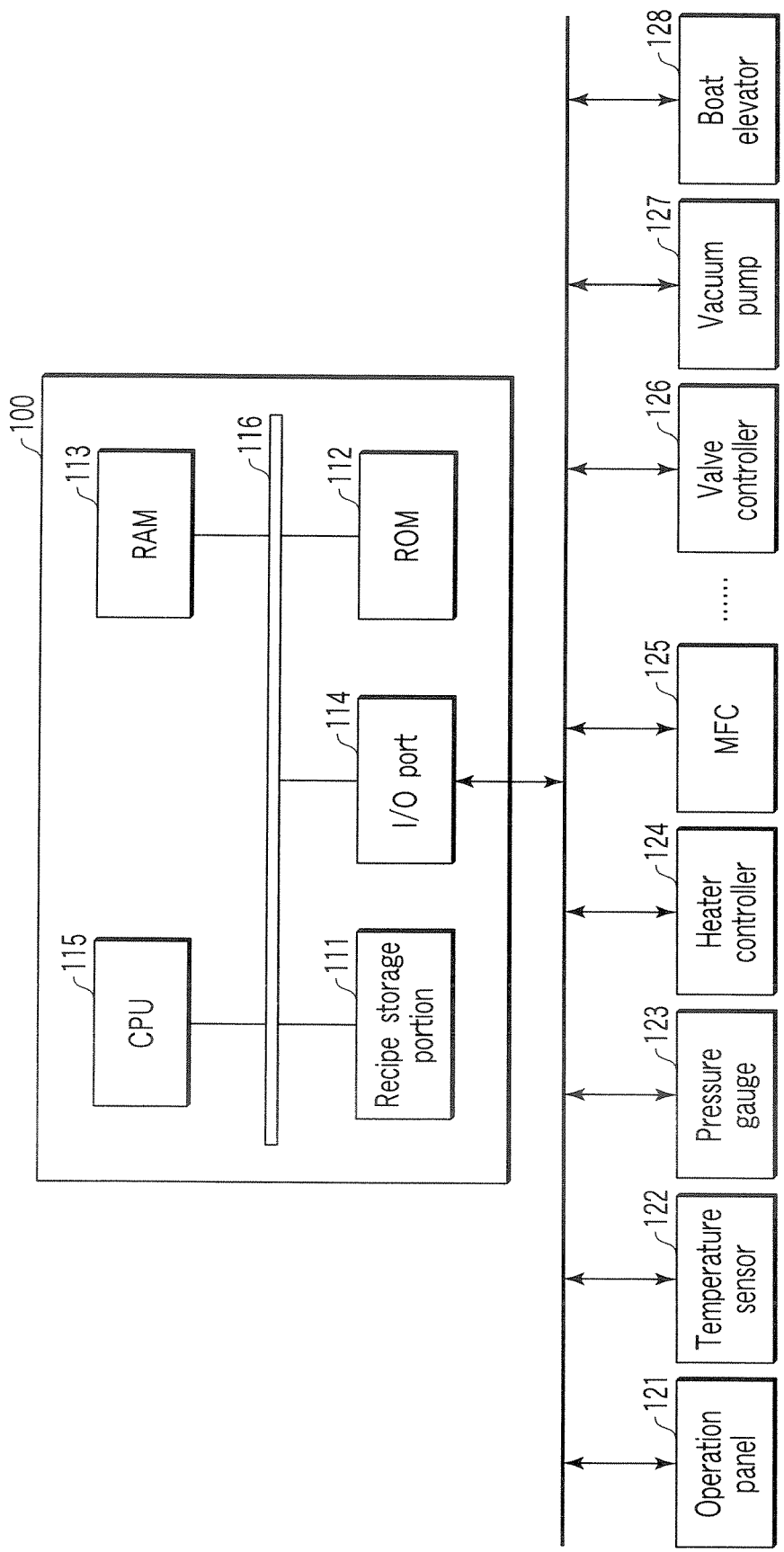
FIG. 2 is a view showing the structure of the control section of the apparatus shown in FIG. 1.

The heat-processing apparatus 1 further includes a control section 100 for controlling respective portions of the apparatus. FIG. 2 is a view showing the structure of the control section 100. As shown in FIG. 2, the control section 100 is connected to an operation panel 121, (a group of) temperature sensors 122, (a group of) pressure gages 123, a heater controller 124, MFCs 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. Temperature sensors 122 are configured to measure the temperature at respective portions inside the reaction tube 2 and exhaust line 5, and transmit measurement values to the control section 100. The pressure gages 123 are configured to measure the pressure at respective portions inside the reaction tube 2 and exhaust line 5, and transmit measurement values to the control section 100.

The heater controller 124 is configured to control the heater 8 and heater 16. The heater controller 124 turns on the heater 8 and heater 16 to generate heat, in accordance with instructions from the control section 100. The heater controller 124 is also configured to measure the power consumption of the heater 8 and heater 16, and transmit it to the control section 100.

The MFCs 125 are respectively disposed on piping lines, such as the process gas feed lines 17 and purge gas feed line 1. Each MFC 125 is configured to control the flow rate of a gas flowing through the corresponding line in accordance with instructed values received from the control section 100. Further, each MFC 125 is configured to measure the flow rate of a gas actually flowing, and transmit the reading to the control section 100.

The valve controllers 126 are respectively disposed on piping lines and configured to control the opening rate of valves disposed on piping lines, in accordance with instructed values received from the control section 100. The vacuum pump 127 is connected to the exhaust line 5 and configured to exhaust gas inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat-processing apparatus 1 is manufactured, only the setup recipe is initially stored. The setup recipe is executed when a thermal model or the like for a specific heat-processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a recording medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat-processing apparatus 1, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the reaction tube 2 and exhaust line 5. Further, the CPU 115 outputs control signals, based on measurement data, to the heater controller 124, MFCs 125, valve controllers 126, and vacuum pump 127, to control the respective portions mentioned above in accordance with a process recipe.

Figure 4:
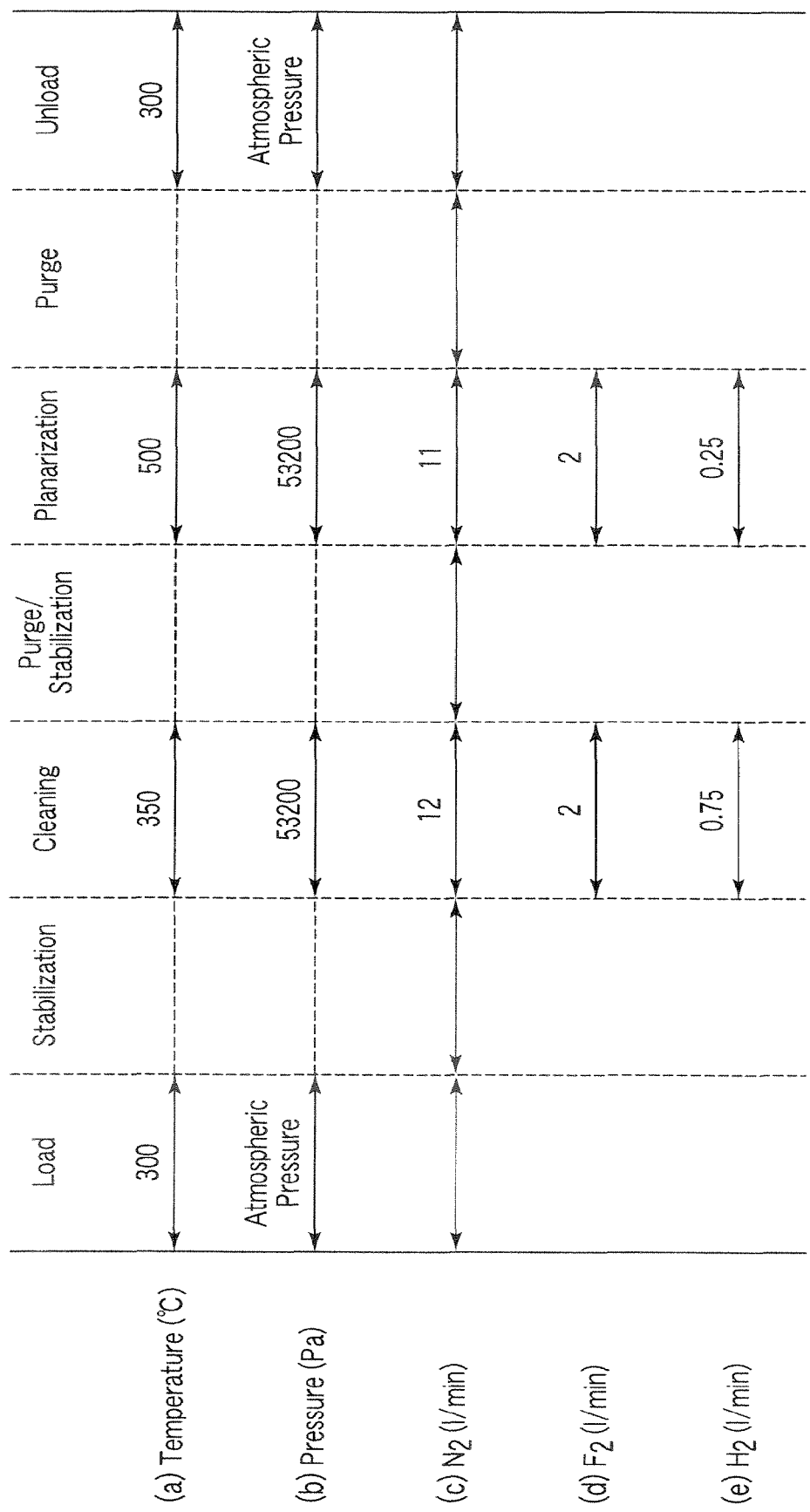
FIG. 4 is a view showing the recipe of cleaning and planarizing processes according to an embodiment of the present invention.

Next, an explanation will be given of a method of using the heat-processing apparatus 1 described above, with reference to FIGS. 3 and 4. Specifically, at first, a silicon nitride film is formed on semiconductor wafers W within the reaction tube 2. Then, by-product films, which contain silicon nitride as the main component (it means 50% or more), deposited inside the reaction tube 2 are removed. Then, the inner surface of the reaction tube 2 is chemically planarized. FIG. 3 is a view showing the recipe of a film formation process according to an embodiment of the present invention. FIG. 4 is a view showing the recipe of cleaning and planarizing processes according to an embodiment of the present invention.

The respective components of the heat-processing apparatus 1 described below are operated under the control of the control section 100 (CPU 115). The temperature and pressure inside the reaction tube 2 and the gas flow rates during the processes are set in accordance with the recipe shown in FIGS. 3 and 4, while the control section 100 (CPU 115) controls the heater controller 124 (for the heaters 8 and 16), MFCs 125 (on the process gas feed line 17 and purge gas feed line 18), valve controllers 126, and vacuum pump 127, as described above.

In the film formation process, at first, the interior of the reaction tube 2 is heated by the heater 16 at a predetermined load temperature, such as 300° C., as shown in FIG. 3, (a). Further, nitrogen ($N_2$) is supplied through the purge gas feed line 18 into the reaction tube 2 at a predetermined flow rate, as shown in FIG. 3, (c). Then, a wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 3, (c). Further, the interior of the reaction tube 2 is heated by the heater 16 to a predetermined film formation temperature (process temperature), such as 600° C., as shown in FIG. 3, (a). Furthermore, gas inside the reaction tube 2 is exhausted to set the interior of the reaction tube 2 at a predetermined pressure, such as 13.3 Pa (0.1 Torr), as shown in FIG. 3, (b). The pressure reduction and heating operations are kept performed until the reaction tube 2 is stabilized at the predetermined pressure and temperature (stabilization step).

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, a first film formation gas containing a silicon-containing gas and a second film formation gas containing a nitriding gas are supplied through the process gas feed line 17 into the reaction tube 2. In this embodiment, the first film formation gas contains hexachlorodisilane ($Si_2Cl_6$) supplied at a predetermined flow rate, such as 0.1 liters/min, as shown in FIG. 3, (d). The second film formation gas contains ammonia ($NH_3$) supplied at a predetermined flow rate, such as 1 liters/min, as shown in FIG. 3, (e).

The hexachlorodisilane and ammonia supplied into the reaction tube 2 cause a thermal decomposition reaction, using heat inside the reaction tube 2. The decomposition components produce silicon nitride ($Si_3N_4$), from which a silicon nitride film is formed on the surface of the semiconductor wafers W (film formation step).

When the silicon nitride film formed on the surface of the semiconductor wafers W reaches a predetermined thickness, the supply of hexachlorodisilane and ammonia through the process gas feed line 17 is stopped. Then, the interior of the reaction tube 2 is exhausted, and nitrogen is supplied through the purge gas feed line 18 at a predetermined flow rate, as shown in FIG. 3, (c). By doing so, the gas inside the reaction tube 2 is exhausted to the exhaust line 5 (purge step). It is preferable to repeat the gas exhaust and nitrogen gas supply for the interior of the process tube 2 a plurality of times, in order to reliably exhaust the gas inside the process tube 2.

Then, the interior of the reaction tube 2 is set by the heater 16 at a predetermined temperature, such as 300° C., as shown in FIG. 3, (a). Further, nitrogen is supplied through the purge gas feed line 18 into the reaction tube 2 at a predetermined flow rate, as shown in FIG. 3, (c). The pressure inside the process tube 2 is thereby returned to atmospheric pressure, as shown in FIG. 3, (b). Then, the lid 6 is moved down by the boat elevator 128, and the wafer boat 11 is thereby unloaded (unload step).

Repeating this film formation process a plurality of times, silicon nitride produced by the film formation process is deposited (adhered) not only on the surface of semiconductor wafers W, but also on the inner surface of the reaction tube 2 and so forth, as by-product films. Accordingly, after the film formation process is repeated a plurality of times, a cleaning process is performed to remove the by-product films containing silicon nitride as the main component. Further, a planarizing process is performed to remove cracks exposed on the inner surface of the reaction tube 2 when the by-product films are removed therefrom by the cleaning process. These cleaning and planarizing processes are performed by utilizing etching actions. The conditions of the cleaning process are arranged such that the etching rate for silicon nitride is higher and the etching rate for the material (quartz) forming the inner surface of the reaction tube 2 is lower. On the other hand, the conditions of the planarizing process are arranged such that the etching rate for quartz is higher.

In the cleaning process, at first, the interior of the reaction tube 2 is maintained by the heater 16 at a predetermined load temperature, such as 300° C., as shown in FIG. 4, (a). Further, nitrogen is supplied through the purge gas feed line 18 into the reaction tube 2 at a predetermined flow rate, as shown in FIG. 4, (c). Then, an empty wafer boat 11 that holds no semiconductor wafers W is placed on the lid 6, and the lid 6 is moved up by the boat elevator 128. Consequently, the wafer boat 11 is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 4, (c). Further, the interior of the reaction tube 2 is heated by the heater 16 at a predetermined cleaning temperature, such as 350° C., as shown in FIG. 4, (a). Furthermore, gas inside the reaction tube 2 is exhausted to set the interior of the reaction tube 2 at a predetermined pressure, such as 53,200 Pa (400 Torr), as shown in FIG. 4, (b). The pressure reduction and heating operations are kept performed until the reaction tube 2 is stabilized at the predetermined pressure and temperature (stabilization step).

When the interior of the reaction tube 2 is stabilized at the predetermined pressure and temperature, a cleaning gas is supplied through the process gas feed line 17 into the reaction tube 2. In this embodiment, the cleaning gas contains fluorine ($F_2$) supplied at a predetermined flow rate, such as 2 liters/min, as shown in FIG. 4, (d), hydrogen ($H_2$) supplied at a predetermined flow rate, such as 0.75 liters/min, as shown in FIG. 4(e), and nitrogen or dilution gas supplied at a predetermined flow rate, such as 12 liters/min, as shown in FIG. 4, (c).

The cleaning gas is heated in the reaction tube 2, and fluorine in the cleaning gas is activated, thereby forming a state in which a number of reactive free atoms are present. The activated fluorine comes into contact with by-product films (containing silicon nitride as the main component) deposited on the inner surface of the reaction tube 2 and so forth. Consequently, the by-product films are etched and removed (cleaning step).

In this cleaning step, the temperature inside the reaction tube 2 is preferably set to be lower than 400° C., and more preferably to be 250° C. to 380° C. If the temperature is lower than 250° C., the cleaning gas is hardly activated, so the etching rate of the cleaning gas for silicon nitride may be lower than the necessary value. If the temperature is higher than 380° C., the etching rate for quartz or silicon carbide (SiC) may become too high, so the etching selectivity is deteriorated.

In this cleaning step, the pressure inside the reaction tube 2 is preferably set to be 13.3 Pa (0.1 Torr) to 66.5 kPa (500 Torr), and more preferably to be 13.3 kPa (100 Torr) to 59.85 kPa (450 Torr). Where this range is used, the etching rate for silicon nitride is high, so the etching selectivity thereon against quartz or silicon carbide (SiC) is improved.

For the cleaning gas, the flow rate ratio ($H_2/F_2$) of hydrogen gas relative to fluorine gas is preferably set to be 0.05/2 to 1.95/2, and more preferably to be 0.1/2 to 1/2. Where this range is used, the etching rate for silicon nitride is high, while the etching rate for quartz or silicon carbide (SiC) is low, so the etching selectivity is improved.

When the by-product films deposited inside the reaction tube 2 are removed, the supply of the cleaning gas through the process gas feed line 17 is stopped. Then, the interior of the reaction tube 2 is exhausted, and nitrogen is supplied through the purge gas feed line 18 into the reaction tube 2 at a predetermined flow rate, as shown in FIG. 4, (c). By doing so, the gas inside the reaction tube 2 is exhausted to the exhaust line 5. Further, the interior of the reaction tube 2 is set by the heater 16 at a predetermined temperature, such as 500° C., as shown in FIG. 4, (a). Furthermore, the interior of the reaction tube 2 is set at a predetermined pressure, such as 53,200 Pa (400 Torr), as shown in FIG. 4, (b). These operations are kept performed until the reaction tube 2 is stabilized at the predetermined pressure and temperature (purge/stabilization step).

When the interior of the reaction tube 2 is stabilized at the predetermined pressure and temperature, a planarizing gas is supplied through the process gas feed line 17 into the reaction tube 2. In this embodiment, the planarizing gas contains fluorine ($F_2$) supplied at a predetermined flow rate, such as 2 liters/min, as shown in FIG. 4, (d), hydrogen ($H_2$) supplied at a predetermined flow rate, such as 0.25 liters/min, as shown in FIG. 4(e), and nitrogen supplied at a predetermined flow rate, such as 11 liters/min, as shown in FIG. 4, (c).

The planarizing gas is heated and thereby activated in the reaction tube 2, and etches the entirety of the inner surface of the reaction tube 2 and so forth, thereby chemically planarizing the inner surface of the reaction tube 2 and so forth. Thus, the planarizing step is arranged to etch the entirety of the inner surface of the reaction tube 2 and so forth, thereby removing cracks formed thereon. Consequently, it is possible to suppress a decrease in film formation rate (deposition rate) and particle generation during the film formation process.

In this planarizing step, the temperature inside the reaction tube 2 is preferably set to be 200° C. to 600° C. If the temperature is lower than 200° C., the planarizing gas is hardly activated, so the etching rate of the planarizing gas for quartz may be lower than the necessary value. If the temperature is higher than 600° C., the etching rate for silicon nitride may become too high, so the etching selectivity is deteriorated. This temperature is more preferably set to be 200° C. to 500° C. Where this range is used, the etching uniformity in the longitudinal direction of the reaction tube 2 is improved, so the inner surface of the reaction tube 2 and so forth are further planarized.

In this planarizing step, the pressure inside the reaction tube 2 is preferably set to be 13.3 Pa (0.1 Torr) to 66.5 kPa (500 Torr), and more preferably to be 13.3 kPa (100 Torr) to 59.85 kPa (450 Torr). Where this range is used, the etching rate for quartz or silicon carbide (SiC) becomes high, so the inner surface of the reaction tube 2 and so forth are effectively planarized.

For the planarizing gas, the flow rate ratio ($H_2/F_2$) of hydrogen gas relative to fluorine gas is preferably set to be 0.05/2 to 1.95/2, and more preferably to be 0.1/2 to 1/2. Where this range is used, the etching rate for quartz or silicon carbide (SiC) is high, so the efficiency in removing cracks is improved. Further, the flow rate ratio of hydrogen gas relative to fluorine gas in the planarizing gas is preferably set to be smaller than the flow rate ratio of hydrogen gas relative to fluorine gas in the cleaning gas.

After the inner surface of the reaction tube 2 and so forth are planarized, the supply of fluorine, hydrogen, and nitrogen through the process gas feed line 17 is stopped. Then, the interior of the reaction tube 2 is exhausted, and nitrogen is supplied through the purge gas feed line 18 into the reaction tube 2 at a predetermined flow rate, as shown in FIG. 4, (c). By doing so, the gas inside the reaction tube 2 is exhausted to the exhaust line 5 (purge step).

Then, the interior of the reaction tube 2 is set by the heater 16 at a predetermined temperature, such as 300° C., as shown in FIG. 4, (a). Further, nitrogen is supplied through the purge gas supply line 18 into the reaction tube 2 at a predetermined flow rate, as shown in FIG. 4, (c). The pressure inside the process tube 2 is thereby returned to atmospheric pressure, as shown in FIG. 4, (b). Then, the lid 6 is moved down by the boat elevator 128, and the wafer boat 11 is thereby unloaded (unload step).

As the process described above is being performed, by-product films deposited and cracks formed on the inner surface of the reaction tube 2, the surface of the wafer boat 11, and so forth are removed. Thereafter, a wafer boat 11 with a new lot of semiconductor wafers W mounted thereon is placed on the lid 6, and the film formation process is started again in the manner described above.

<Experiment 1>

Figures 5, 6:
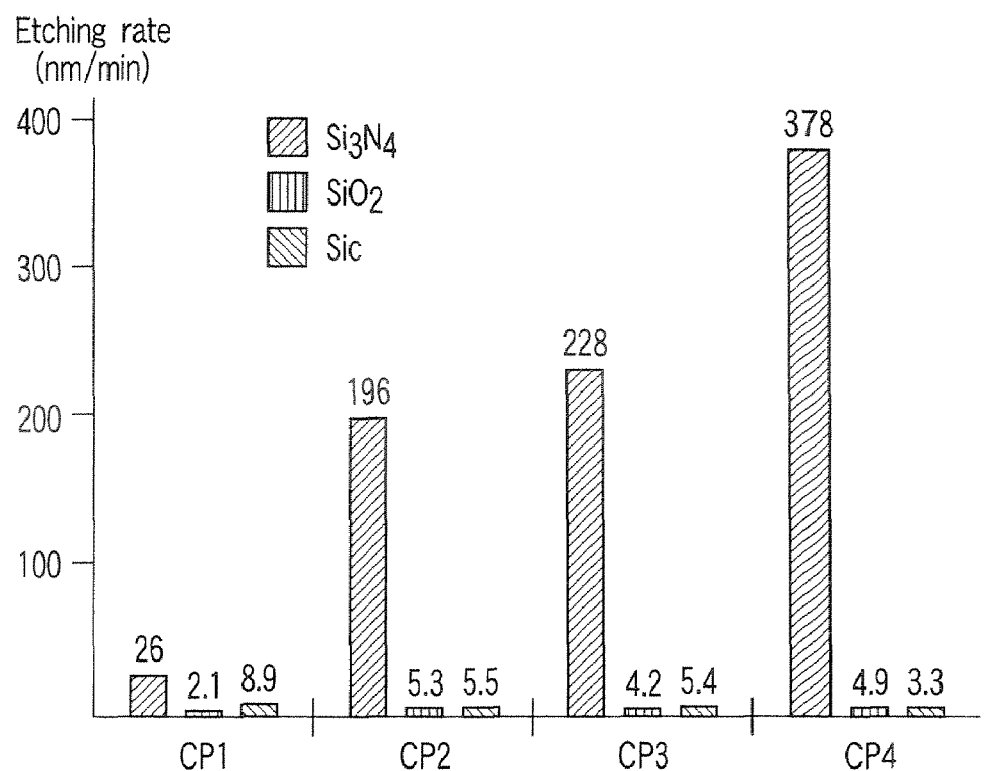
FIG. 5 is a view showing the flow rates (liter/min) of component gases of cleaning gases used in Experiment 1, i.e., compositions CP1 to CP4.
FIG. 6 is a view showing etching rates obtained by the cleaning gases show in FIG. 5.

In the cleaning step described above, in order to remove by-product films containing silicon nitride as the main component, the conditions are arranged such that the etching rate for silicon nitride is higher and the etching rate for the material (quartz) forming the inner surface of the reaction tube 2 is lower. In order to study the composition of the cleaning gas to realize this characteristic, the following experiment was performed. Specifically, cleaning gases were prepared with different values of the flow rates of fluorine gas and hydrogen gas, and the etching rates thereof for silicon nitride ($Si_3N_4$), quartz ($SiO_2$), and silicon carbide (SiC) were measured. In Experiment 1, the temperature inside the reaction tube 2 was set at 300° C., and the pressure inside the reaction tube 2 was set at 53,200 Pa (400 Torr). FIG. 5 is a view showing the flow rates (liter/min) of component gases of cleaning gases used in Experiment 1, i.e., compositions CP1 to CP4.

FIG. 6 is a view showing etching rates obtained by the cleaning gases show in FIG. 5. As shown in FIG. 6, where the cleaning gas contains no hydrogen gas (composition CP1), the etching rate for silicon nitride was low. Accordingly, the cleaning gas needs to contain hydrogen gas. On the other hand, where the cleaning gas contains hydrogen gas (compositions CP2 to CP4), the etching rate for silicon nitride was higher, while the etching rates for quartz and silicon carbide were not increased. Specifically, the etching selectivity for the by-product films relative to the material (quartz or the like) forming the inner surface of the reaction tube 2 is improved. Accordingly, the cleaning gas preferably contains hydrogen gas as well as fluorine gas. Particularly, the composition CP4 rendered a higher etching rate for silicon nitride and a higher etching selectivity, as compared to the compositions CP2 and CP3. Accordingly, the cleaning gas preferably contains a large amount of hydrogen gas, as in the composition CP4 (the flow rate of hydrogen gas was set at 0.75 liters/min).

<Experiment 2>

Figures 7, 8:
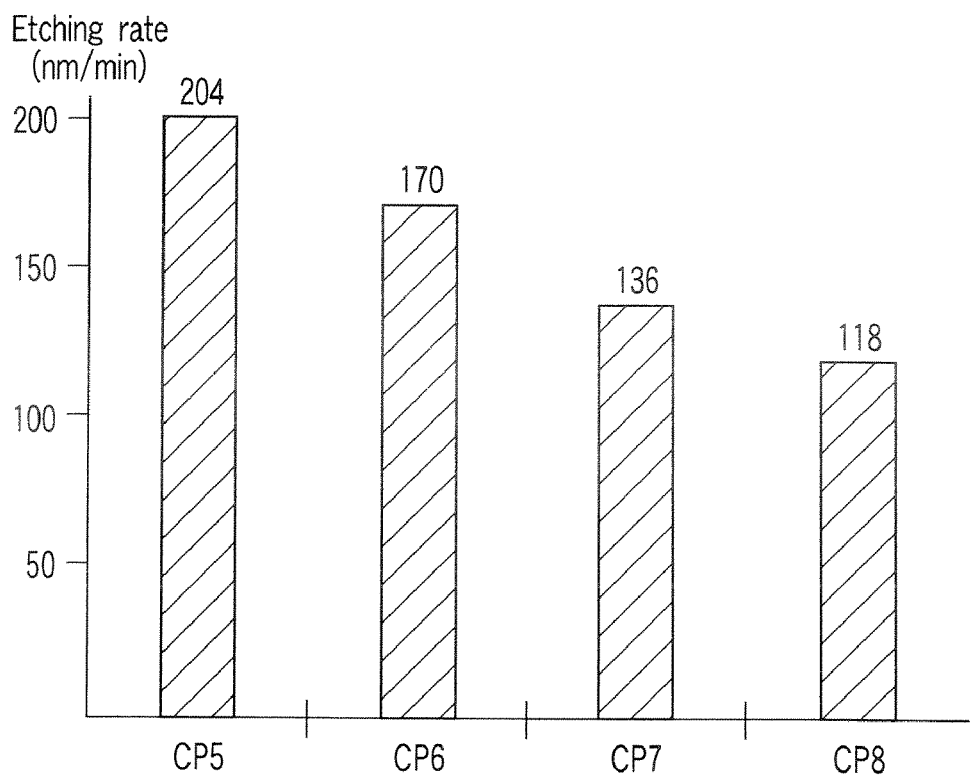
FIG. 7 is a view showing the flow rates (liter/min) of component gases of planarizing gases used in Experiment 2, i.e., compositions CP5 to CP8.
FIG. 8 is a view showing etching rates obtained by the planarizing gases show in FIG. 7.

In the planarizing step described above, in order to remove cracks exposed on the inner surface of the reaction tube 2 when the by-product films are removed therefrom, the conditions are arranged such that the etching rate for quartz (or silicon carbide) is higher. In order to study the composition of the planarizing gas to realize this characteristic, the following experiment was performed. Specifically, planarizing gases were prepared with different values of the flow rate of hydrogen gas, and the etching rate thereof for quartz ($SiO_2$) was measured. In Experiment 2, the temperature inside the reaction tube 2 was set at 550° C., and the pressure inside the reaction tube 2 was set at 53,200 Pa (400 Torr). FIG. 7 is a view showing the flow rates (liter/min) of component gases of planarizing gases used in Experiment 2, i.e., compositions CP5 to CP8.

FIG. 8 is a view showing etching rates obtained by the planarizing gases show in FIG. 7. As shown in FIG. 8, with a decrease in the flow rate of hydrogen gas in the planarizing gas, the etching rate for quartz is increased. On the other hand, as described with reference to FIG. 6, with a decrease in the flow rate of hydrogen gas, the etching rate for silicon nitride is decreased. Accordingly, the planarizing gas preferably contains hydrogen gas at a lower flow rate, as in the composition CP5 (the flow rate of hydrogen gas was set at 0.25 liters/min). The flow rate of hydrogen gas in the planarizing gas is preferably set to be lower than the flow rate of hydrogen gas in the cleaning gas.

<Experiment 3>

An experiment was conducted to examine whether the processes described above would remove by-product films deposited on the inner surface of the reaction tube 2 and planarize the inner surface of the reaction tube 2. Specifically, in accordance with the recipe shown in FIG. 3, a by-product film containing silicon nitride as the main component was deposited to have a thickness of 3 μm on the inner surface of the reaction tube 2. Then, in accordance with the recipe shown in FIG. 4, the inner surface of the reaction tube 2 was processed, and the surface state of the processed inner surface of the reaction tube 2 was examined. Microscope photography was used to examine the surface state of the inner surface of the reaction tube 2.

As a result, after the cleaning process, essentially no by-product films were observed on the inner surface of the reaction tube 2. Accordingly, it has been confirmed that the cleaning process according to the embodiment can remove by-product films deposited inside the reaction tube 2. Further, after the planarizing process, small cracks formed on the inner surface of the reaction tube 2 were completely removed. Accordingly, it has been confirmed that the planarizing process according to the embodiment can sufficiently planarize the inner surface of the reaction tube 2.

<Consequence and Modification>

As described above, according to the embodiment described above, the cleaning step and the planarizing step are sequentially performed, so as to remove by-product films deposited inside the reaction tube 2, and planarize the inner surface of the reaction tube 2. Consequently, it is possible to suppress a decrease in film formation rate (deposition rate) and particle generation during the film formation process. Further, it is possible to suppress a decrease in operating rate, as compared to a case where wet etching is used for cleaning the heat-processing apparatus 1. In addition, since the embodiment described above employs a mixture gas of fluorine, hydrogen, and nitrogen, for each of the cleaning gas and planarizing gas, the process gases can be easily switched.

In the embodiment described above, in order to form a silicon nitride film on semiconductor wafers W, hexachlorodisilane is used as a silicon-containing gas contained in the first film formation gas, and ammonia is used as a nitriding gas contained in the second film formation gas. An alternative combination may be formed of dichlorosilane ($SiH_2Cl_2$) used as a silicon-containing gas and ammonia used as a nitriding gas.

In the embodiment described above, the removal target is by-product films containing silicon nitride as the main component, which are deposited inside the reaction tube 2 when a silicon nitride film is formed on semiconductor wafers W. Alternatively, the present invention may be applied to a case where the removal target is by-product films that are deposited inside the reaction tube 2 when another silicon-containing insulating film (such as a silicon dioxide film or silicon oxynitride film) is formed on semiconductor wafers W. In this case, in order to form a silicon dioxide film or silicon oxynitride film, a first film formation gas containing a silicon-containing gas and a second film formation gas containing an oxidizing gas or oxynitriding gas may be supplied. Further, the substance deposited inside the reaction tube 2 is not limited to a silicon-containing insulating film, and it may be an ammonium chloride film, for example.

In the embodiment described above, the cleaning gas is a mixture gas of fluorine ($F_2$), hydrogen ($H_2$), and nitrogen ($N_2$). However, the cleaning gas may be any gas, as long as it is arranged such that the etching rate for a substance deposited inside the reaction tube 2 is higher than the etching rate for the material (quartz or the like) forming the interior of the reaction tube 2. For example, the cleaning gas may be a mixture gas of fluorine gas, chlorine gas, and nitrogen gas, or a mixture gas of fluorine gas, hydrogen fluoride gas, and nitrogen gas. Further, in the embodiment described above, the planarizing gas is a mixture gas of fluorine gas, hydrogen gas, and nitrogen gas. However, the planarizing gas may be any gas, as long as it contains fluorine gas and hydrogen gas. The planarizing gas may have the same composition as the cleaning gas, or may contain gases of different kinds from those of the cleaning gas.

In the embodiment described above, the planarizing step is performed every time the cleaning step is performed. Alternatively, the planarizing step may be performed when the number of repetitions of the cleaning step reaches a predetermined number. For example, it may be arranged such that, after the film formation process is repeated ten times, the cleaning step is performed to remove by-product films deposited inside the reaction tube 2; and when the number of repetitions of the cleaning step of this timing reaches ten, the planarizing step is performed. In this case, the recipe shown in FIG. 4 is modified where the planarizing step is not performed, such that it ends without performing the purge stabilization step and planarizing step following the cleaning step, but performing the purge step and unload step.

In the embodiment described above, the planarizing gas and cleaning gas contain nitrogen gas as a dilution gas. These gases preferably contain a dilution gas, because the processing time can be more easily controlled if they are so arranged. However, the planarizing gas and cleaning gas may contain no dilution gas. The dilution gas consists preferably of an inactive gas, such as nitrogen gas, helium gas (He), neon gas (Ne), or argon gas (Ar).

In the embodiment described above, the reaction tube 2, lid 6, and wafer boat 11 are made of quartz. Alternatively, these members may be made mainly of a material selected from other silicon-containing materials, such as silicon carbide (SiC). Also in this case, the cleaning step and the planarizing step are sequentially performed, so as to remove by-product films deposited inside the reaction tube 2, and planarize the inner surface of the reaction tube 2.

In the embodiment described above, the process gas feed lines 17 are disposed in accordance with the type of process steps. Alternatively, for example, a plurality of process gas feed lines 17 may be disposed in accordance with the type of gases (e.g., five lines for fluorine, hydrogen, hexachlorodisilane, ammonia, and nitrogen). Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the embodiments described above, the heat-processing apparatus employed is a heat-processing apparatus of the batch type having a single-tube structure. However, for example, the present invention may be applied to a vertical heat-processing apparatus of the batch type having a reaction tube 2 of the double-tube type, which is formed of inner and outer tubes. Alternatively, the present invention may be applied to a heat-processing apparatus of the single-substrate type. The target substrate is not limited to a semiconductor wafer W, and it may be a glass substrate for, e.g., an LCD.

The control section 100 of the heat-processing apparatus is not limited to a specific system, and it may be realized by an ordinary computer system. For example, a program for executing the process described above may be installed into a multi-purpose computer, using a recording medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined recording medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of using a vertical film formation apparatus for a semiconductor process configured to form a thin film on a plurality of target substrates held at intervals in a vertical direction inside a reaction chamber, the method comprising:
    removing by a cleaning gas a by-product film deposited on an inner surface of the reaction chamber without the target substrates held therein, while supplying the cleaning gas into the reaction chamber, and setting an interior of the reaction chamber at a first temperature and a first pressure to activate the cleaning gas; and
    then, chemically planarizing by a planarizing gas consisting essentially of $F_2$ gas, $H_2$ gas, and $N_2$ gas, the inner surface of the reaction chamber without the target substrates held therein, while supplying the planarizing gas into the reaction chamber, and setting the interior of the reaction chamber at a second temperature and a second pressure to activate the planarizing gas,
    wherein the inner surface of the reaction chamber contains as a main component at least one material selected from the group consisting of quartz and silicon carbide.

2. The method according to claim 1, wherein the second pressure is set to be 13.3 Pa to 66.5 kPa.

3. The method according to claim 2, wherein the second pressure is set to be 13.3 kPa to 59.85 kPa.

4. The method according to claim 1, wherein the second temperature is set to be 200 to 600° C.

5. The method according to claim 1, wherein the planarizing gas is arranged such that a flow rate ratio of $H_2$ gas relative to $F_2$ gas is set to be 0.05/2 to 1.95/2.

6. The method according to claim 1, wherein the by-product film contains as a main component a substance selected from the group consisting of silicon nitride, silicon oxide, and silicon oxynitride, and the cleaning gas contains $F_2$ gas and $H_2$ gas.

7. The method according to claim 6, wherein the by-product film contains silicon nitride as a main component, and a flow rate ratio of $H_2$ gas relative to $F_2$ gas in the planarizing gas is set to be smaller than a flow rate ratio of $H_2$ gas relative to $F_2$ gas in the cleaning gas.

8. The method according to claim 6, wherein the first temperature is set to be 250 to 380° C.

9. The method according to claim 6, wherein the first pressure is set to be 13.3 Pa to 66.5 kPa.

10. The method according to claim 6, wherein the cleaning gas is arranged such that a flow rate ratio of $H_2$ gas relative to $F_2$ gas is set to be 0.05/2 to 1.95/2.

11. The method according to claim 10, wherein the cleaning gas consists essentially of $F_2$ gas, $H_2$ gas, and $N_2$ gas.

12. The method according to claim 6, wherein, in each of periods before the removing and after the planarizing, the method further comprises
    forming the thin film of a substance, which is selected from the group consisting of silicon nitride, silicon oxide, and silicon oxynitride, on the target substrates by CVD within the reaction chamber, while supplying a first film formation gas containing a silicon-containing gas and a second film formation gas containing a gas, which is selected from the group consisting of a nitriding gas, an oxidizing gas, and an oxynitriding gas, into the reaction chamber.

13. The method according to claim 1, wherein the method further comprises purging the interior of the reaction chamber with an inactive gas between the removing and the planarizing.

14. A method of using a vertical film formation apparatus for a semiconductor process configured to form a silicon nitride film on a plurality of target substrates held at intervals in a vertical direction inside a reaction chamber, the method comprising:

removing by a cleaning gas consisting essentially of $F_2$ gas, $H_2$ gas, and $N_2$ gas by-product film deposited on an inner surface of the reaction chamber without the target substrates held therein, while supplying the cleaning gas into the reaction chamber, and setting an interior of the reaction chamber at a first temperature and a first pressure to activate the cleaning gas; and then, chemically planarizing by a planarizing gas consisting essentially of $F_2$ gas, $H_2$ gas, and $N_2$ gas, the inner surface of the reaction chamber without the target substrates held therein, while supplying the planarizing gas into the reaction chamber, and setting the interior of the reaction chamber at a second temperature and a second pressure to activate the planarizing gas, wherein the inner surface of the reaction chamber contains as a main component a material selected from the group consisting of quartz and silicon carbide, the by-product film contains silicon nitride as a main component, and a flow rate ratio of $H_2$ gas relative to $F_2$ gas in the planarizing gas is set to be smaller than a flow rate ratio of $H_2$ gas relative to $F_2$ gas in the cleaning gas.

15. The method according to claim 14, wherein the second temperature is higher than the first temperature.

16. The method according to claim 15, wherein the planarizing gas is arranged such that a flow rate ratio of $H_2$ gas relative to $F_2$ gas is set to be 0.1/2 to 1/2.

17. The method according to claim 14, wherein, before the removing, the method further comprises forming the silicon nitride film on the target substrates by CVD within the reaction chamber, while supplying a first film formation gas containing a silicon-containing gas and a second film formation gas containing a nitriding gas into the reaction chamber.

\* \* \* \* \*